United States Patent
Prather

(10) Patent No.: US 11,379,158 B2
(45) Date of Patent: *Jul. 5, 2022

(54) APPARATUSES AND METHODS FOR CONFIGURING I/OS OF MEMORY FOR HYBRID MEMORY MODULES

(71) Applicant: MICRON TECHNOLOGY, INC., Boise, ID (US)

(72) Inventor: Matthew A. Prather, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 30 days.

This patent is subject to a terminal disclaimer.

(21) Appl. No.: 16/820,319

(22) Filed: Mar. 16, 2020

(65) Prior Publication Data

US 2020/0218476 A1 Jul. 9, 2020

Related U.S. Application Data

(63) Continuation of application No. 15/841,126, filed on Dec. 13, 2017, now Pat. No. 10,698,640, which is a continuation-in-part of application No. 15/470,698, filed on Mar. 27, 2017, now Pat. No. 10,423,363, which is a continuation of application No.
(Continued)

(51) Int. Cl.
*G06F 3/06* (2006.01)
*G06F 12/02* (2006.01)
*G06F 13/16* (2006.01)

(52) U.S. Cl.
CPC .......... *G06F 3/0685* (2013.01); *G06F 3/061* (2013.01); *G06F 3/0658* (2013.01); *G06F 12/0246* (2013.01); *G06F 13/1668* (2013.01); *G06F 2212/205* (2013.01)

(58) Field of Classification Search
None
See application file for complete search history.

(56) References Cited

U.S. PATENT DOCUMENTS

| | | | |
|---|---|---|---|
| 7,499,322 | B2 | 3/2009 | Lee et al. |
| 8,397,013 | B1 | 3/2013 | Rosenband et al. |
| 9,779,016 | B1 | 10/2017 | Shen et al. |

(Continued)

FOREIGN PATENT DOCUMENTS

| JP | 2001005723 A | 1/2001 |
|---|---|---|
| JP | 2007026504 A | 2/2007 |

(Continued)

OTHER PUBLICATIONS

English translation of Notice of Preliminary Rejection for KR Application No. 10-2019-7021947, dated Mar. 31, 2020.

(Continued)

*Primary Examiner* — Kevin Verbrugge
(74) *Attorney, Agent, or Firm* — Dorsey & Whitney LLP

(57) ABSTRACT

Apparatuses, hybrid memory modules, memories, and methods for configuring I/Os of a memory for a hybrid memory module are described. An example apparatus includes a non-volatile memory, a control circuit coupled to the non-volatile memory, and a volatile memory coupled to the control circuit. The volatile memory is configured to enable a first subset of I/Os for communication with a bus and enable a second subset of I/O for communication with the control circuit, wherein the control circuit is configured to transfer information between the volatile memory and the non-volatile memory.

20 Claims, 3 Drawing Sheets

Related U.S. Application Data

13/965,008, filed on Aug. 12, 2013, now Pat. No. 9,921,980.

(56) References Cited

U.S. PATENT DOCUMENTS

| | | | |
|---|---|---|---|
| 9,921,980 | B2 | 3/2018 | Prather |
| 2001/0053090 | A1 | 12/2001 | Takata et al. |
| 2003/0028733 | A1 | 2/2003 | Tsunoda et al. |
| 2004/0019756 | A1 | 1/2004 | Perego et al. |
| 2004/0049629 | A1 | 3/2004 | Miura et al. |
| 2006/0294295 | A1 | 12/2006 | Fukuzo |
| 2007/0147162 | A1 | 6/2007 | Kim et al. |
| 2009/0031099 | A1 | 1/2009 | Sartore |
| 2009/0187689 | A1 | 7/2009 | Roohparvar |
| 2010/0008175 | A1 | 1/2010 | Sweere et al. |
| 2010/0217924 | A1 | 8/2010 | Panabaker et al. |
| 2010/0274956 | A1 | 10/2010 | Karamcheti et al. |
| 2011/0153903 | A1 | 6/2011 | Hinkle et al. |
| 2012/0131253 | A1 | 5/2012 | Mcknight et al. |
| 2012/0271990 | A1 | 10/2012 | Chen et al. |
| 2012/0317382 | A1 | 12/2012 | Steed |
| 2013/0039128 | A1 | 2/2013 | Amidi et al. |
| 2013/0086309 | A1 | 4/2013 | Lee et al. |
| 2013/0138872 | A1 | 5/2013 | Karamcheti et al. |
| 2014/0325134 | A1 | 10/2014 | Carpenter et al. |
| 2014/0337589 | A1 | 11/2014 | Carpenter et al. |
| 2015/0046631 | A1 | 2/2015 | Prather |
| 2015/0127890 | A1 | 6/2015 | Brainard et al. |
| 2017/0199708 | A1 | 7/2017 | Prather |
| 2018/0107433 | A1 | 4/2018 | Prather |

FOREIGN PATENT DOCUMENTS

| | | |
|---|---|---|
| KR | 20080108975 A | 12/2008 |
| KR | 20090026276 A | 3/2009 |
| KR | 20110034436 A | 4/2011 |
| KR | 101097777 B1 | 12/2011 |
| KR | 2012054674 A | 5/2012 |
| WO | 2013028827 A1 | 2/2013 |
| WO | 2015023445 A1 | 2/2015 |

OTHER PUBLICATIONS

European Examination Report dated Feb. 28, 2018 for European Application No. 14835969.8.

First OA, JP App. No. 2016-533336 dated Apr. 4, 2017.

First Office Action received for TW Application No. 103127677 dated Feb. 19, 2016.

Notice Of Preliminary Rejection for KR Application No. 10-2018-7015376, dated Aug. 9, 2018.

Second Office Action dated Jan. 24, 2018 for Chinese Application No. 201480045373.9.

Second Office Action received for TW Application No. 103127677 dated Nov. 2, 2016.

First Office Action dated Jun. 1, 2017 for China Application No. 201480045373.

International Search Report and Written Opinion for PCT/US2014/049096 dated Nov. 17, 2014.

Notice of Preliminary Rejection dated Jul. 20, 2017 for Korean Patent Application No. 10-2016-7006294.

US 11,379,158 B2

APPARATUSES AND METHODS FOR CONFIGURING I/OS OF MEMORY FOR HYBRID MEMORY MODULES

CROSS-REFERENCE TO RELATED APPLICATION(S)

This application is a continuation of U.S. patent application Ser. No. 15/841,126 filed on Dec. 13, 2017, issued as U.S. Pat. No. 10,698,640 on Jun. 30, 2020, which is a continuation of U.S. patent application Ser. No. 15/470,698 filed on Mar. 27, 2017 and issued as U.S. Pat. No. 10,423,363 on Sep. 24, 2019, which is a continuation of U.S. patent application Ser. No. 13/965,008, filed on Aug. 12, 2013 and issued as U.S. Pat. No. 9,921,980 on Mar. 20, 2018. These applications and patents are incorporated by reference herein in their entirety and for all purposes.

DESCRIPTION OF RELATED ART

A hybrid memory module is a memory module that includes volatile memory (e.g., dynamic random access memory (DRAM)) and non-volatile memory (e.g., flash memory). In some examples, a hybrid memory module may function as a standard volatile memory module during normal operation, with a capability to transfer data from the volatile memory to the non-volatile memory, as commanded by a host controller. Current designs use multiplexer integrated circuits (ICs) that allow switching of a signal bus from between the host controller and the volatile memory of the memory module to between the volatile memory and a memory module controller, which is coupled to the non-volatile memory. The memory module controller may be configured to control operation of the volatile and/or non-volatile memory, for example, controlling the volatile and non-volatile memories to transfer data between one another. These multiplexer ICs may be costly, consume additional space on the memory module, and may add electrical loading to the signal bus between the host controller and the volatile memory.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

Figure 1:
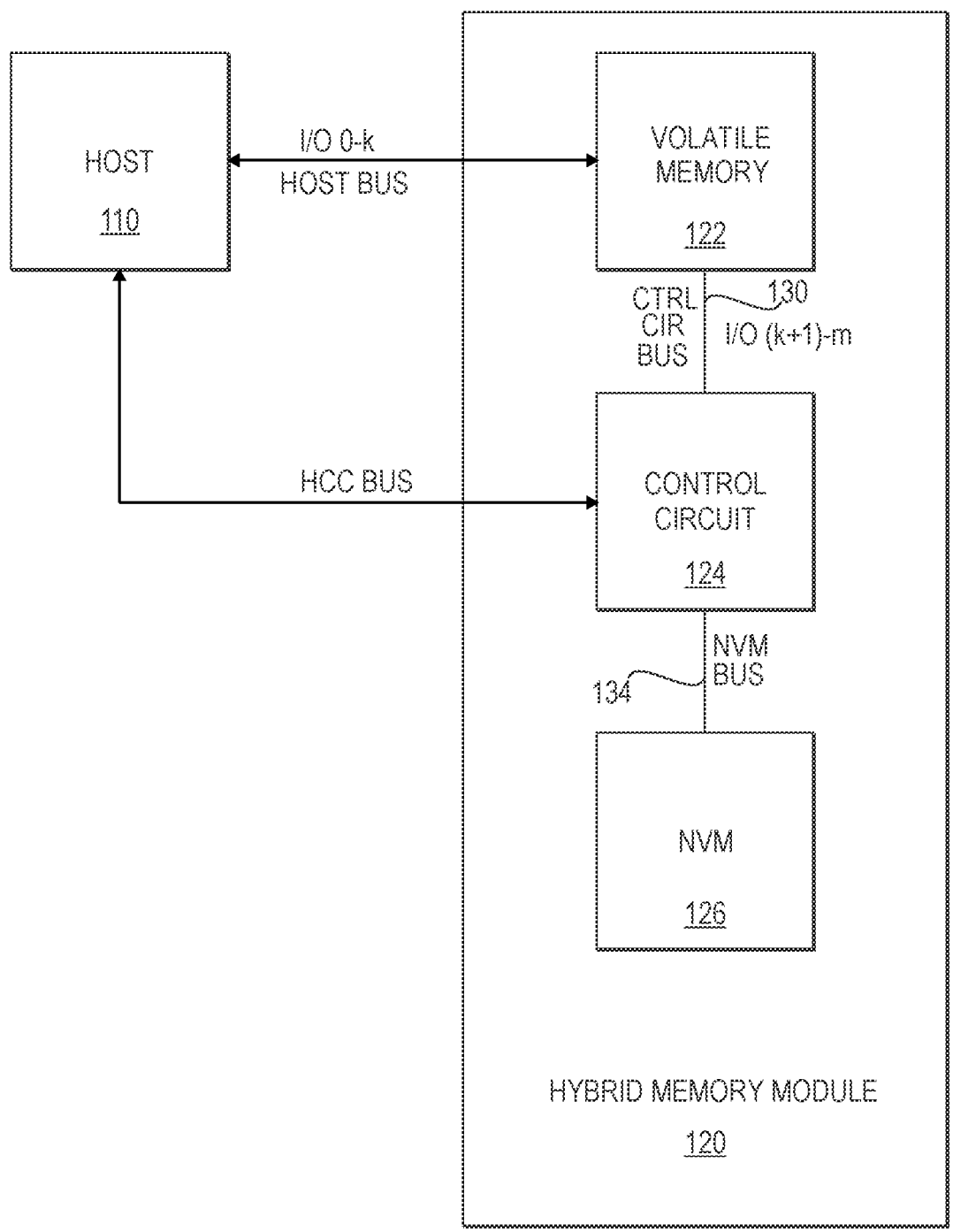
FIG. 1 is a block diagram of a particular illustrative embodiment of an apparatus including a hybrid memory module according to an embodiment of the disclosure.

Referring to FIG. 1, a particular illustrative embodiment of an apparatus including a hybrid memory module according to an embodiment of the invention is disclosed and generally designated 100. The apparatus 100 may be an integrated circuit, a memory device, a memory system, an electronic device or system, a smart phone, a tablet, a computer, a server, etc. The apparatus 100 may include a hybrid memory module 120. The hybrid memory module 120 includes volatile memory 122 that is coupled to a host 110 via a host bus. The volatile memory 122 may include one or more volatile memories, for example, DRAMs. The hybrid memory module 120 may further include a control circuit 124 that is coupled to the volatile memory 122 via a respective control circuit bus 130. The control circuit 124 may be further coupled to the host 110 via a host-control circuit (HCC) bus. The control circuit 124 may be coupled to non-volatile memory (NVM) 126 via an NVM bus 134. The NVM 126 may include one or more non-volatile memories, for example, flash memory. Memories of the volatile memory 122 may be configured to communicate with the host 110 over the host bus using a different subset of I/Os (e.g., first subset of I/Os) than when communicating with the control circuit 124 over the control circuit bus 130 (e.g., second subset of I/Os). During communication, information (e.g., commands, address, data, etc.) may be transferred, for example, between the memories of the volatile memory 122 and the host 110 and/or between the memories of the volatile memory 122 and the control circuit 124 and NVM 126.

As previously described, the volatile memory 122 may include one or more volatile memories. The volatile memories may be any type of volatile memory, for example, any double data rate (DDR) synchronous DRAM (SDRAM) architecture (e.g., DDR SDRAM, DDR2 SDRAM, DDR3 SDRAM, DDR4 SDRAM, etc.). The memories of the volatile memory 122 may have a ×4, ×8, ×16, or greater configuration (e.g., includes 4, 8, 16, or greater I/Os, respectively). Further, the host bus between the host 110 and memories of the volatile memory 122 may support a ×4, a ×8, or other configuration. For example, the host bus may be a 72-bit bus. Each of the volatile memories of the volatile memory 122 may use a portion of the host bus to communicate with the host 110. For example, the volatile memory 122 may include memories which each have a ×8 configuration, and consequently, each memory may use a respective 8-bits of the 72-bit host bus for communication. The control circuit bus 130 may be smaller than the host bus. For example, the control circuit bus 130 may be 40-bits while the host bus may be 72-bits.

In some embodiments, each memory of the volatile memory 122 may include a respective mode register that is configured to store operating parameters for the memory. In some embodiments, the mode registers may be programmed with information to set a mode of operation that designates subsets of I/Os for separate communication. For example, a memory may include I/Os 0-m for communication. The mode register may be programmed with information to set a first mode of operation that designates a first subset of I/Os 0-k (k<m) for communication and may be further programmed with information to set a second mode of operation that designates a second subset of I/Os (k+1)-m for separate communication. By setting the different modes of operation, the memories of the volatile memory 122 may be configured to communicate with the host 110 over the host bus using a different subset of I/Os (e.g., first subset of I/Os) than when communicating with the control circuit 124 over the control circuit bus 130 (e.g., second subset of I/Os).

The control circuit 124 may transfer information between the volatile memory 122 and the NVM 126. The control circuit 124 may include an application-specific integrated circuit (ASIC), a field-programmable gate array (FPGA), or other integrated circuitry. The control circuit 124 may perform error calculations and/or checking functions during the transfer of data between the volatile memory 122 and the NVM 126.

The NVM 126 may include any type of non-volatile memory. For example, the NVM 126 may include flash memory, such as NAND flash memory and NOR flash memory. The NVM bus 134 between the control circuit 124 and the NVM 126 may be smaller than the control circuit bus 130 between the volatile memory 122 and the control circuit 124. A storage capacity of the NVM 126 may be greater than a storage capacity of the volatile memory 122. For example, the storage capacity of the NVM 126 may be at least two times the storage capacity of the volatile memory 122. In another example, the storage capacity of the NVM 126 may be two times to four times the storage capacity of the volatile memory 122.

In operation, the volatile memory 122 may selectively communicate with the host 110 and/or the control circuit 124 via the respective subset of I/Os 0-N (e.g., I/Os 0-k for the host 110; I/Os (k+1)-m for the control circuit 124) based on a mode of operation. In an example, during a first mode of operation (e.g., normal operation), the host 110 communicates with the volatile memory 122 via a host bus to perform memory access operations. The host 110 may set the volatile memory 122 to the first mode of operation by sending mode register commands to the volatile memory 122 to program information for the first mode of operation. Communication between the volatile memory 122 and the control circuit 124 may be disabled during the first mode of operation. Transition to a second mode of operation may be initiated by the host 110. For example, the host 110 may send a command to the control circuit 124 via the HCC bus to transition to the second mode. In the second mode, the host 110 relinquishes control of the volatile memory 122 to the control circuit 124. The control circuit 124 may set the memory of the volatile memory 122 to the second mode of operation by sending mode register commands and information to the memory of the volatile memory 122 to program the mode registers with information to set the second mode of operation. While in the second mode of operation, the memory of the volatile memory 122 may communicate with the control circuit 124 via a control circuit bus 130. The second mode of operation may be used, for example, to provide data stored by the memory of the volatile memory 122 to the NVM 126 to be stored. In some embodiments, information is transferred to the NVM from the memory of the volatile memory with the control circuit 124 managing the transfer of the information.

While in the second mode of operation, communication between the control circuit 124 and the memory of the volatile memory 122 via the control circuit bus 130 may use a different subset of I/Os than the subset of I/Os used during communication between the host 110 and the memory of the volatile memory 122 via the host bus. For example, in a first mode of operation, the memories of the volatile memory 122 may be configured to communicate with the host 110 via the host bus using the respective I/Os 0-k (e.g., the first subset of I/Os) to perform memory access operations. Further, in the second mode of operation, the memories of the volatile memory 122 may be configured to communicate with the control circuit 124 via the control circuit bus 130 using the respective I/Os (k+1)-m (e.g., the second subset of I/Os) to perform memory access operations.

As previously described, the memories of the volatile memory 122 may receive mode register commands that program information in the mode registers via the host 110 or the control circuit 124. The memories of the volatile memory 122 may enable a subset of I/Os 0-m for communication based on the information programmed to the mode registers. For example, responsive to the mode registers programmed with first information for the first mode of operation, the memories of the volatile memory 122 may enable communication over the respective I/Os 0-k (e.g., the first subset of I/Os). The memory access operations while in the first mode of operation may include the host 110 retrieving data from and providing data to the memories of the volatile memory 122. For example, the host 110 may provide commands, addresses, and data to the memories of the volatile memory 122 via the host bus using the I/Os 0-k, and the memories of the volatile memory 122 may provide data as well as other information to the host 110 via the host bus using the I/Os 0-k. The first mode of operation may correspond to normal operation of the apparatus 100.

In changing the memories of the volatile memory 122 to a second mode of operation, the host 110 may program information in the mode registers of the memories of the volatile memory 122 for the second mode of operation. The memories of the volatile memory 122 may enable communication over the respective I/Os (k+1)-m based on the information programmed in the mode registers for the second mode of operation. Memory access operations while in the second mode of operation may include the control circuit 124 retrieving data from and providing data to the memories of the volatile memory 122. For example, the control circuit 124 may provide commands, addresses, and data to the memories of the volatile memory 122 via the control circuit bus 130 using the I/Os (k+1)-m, and the memories of the volatile memory 122 may provide data as well as other information to the control circuit 124 via the control circuit 130 bus using the I/Os (k+1)-m.

In an embodiment, while in the second mode of operation, the control circuit 124 may transfer information from the memories of the volatile memory 122 to the NVM 126. For example, the memories of the volatile memory may be set in the second mode of operation for a power failure event. The data stored by the memories of the volatile memory 122 may be transferred to the NVM 126 via the control circuit 124 to maintain the data through the power failure. Once power is re-applied, data previously stored in the NVM 126 may be restored to the volatile memory 122 via the control circuit 124. Once the transfer is complete, the memories of the volatile memory 122 may be set to the first mode of operation.

As previously described, the memories of the volatile memory 122 may be configured according to a ×4, ×8, ×16, or greater architecture (e.g., includes 4, 8, 16, or greater I/Os, respectively). Further, the host bus between the host 110 and the volatile memory 122 may support a ×4, a ×8, or another architecture for the memories of the volatile memory 122. The memories of the volatile memory 122 may be configured to use a subset of the available I/Os to communicate with the host 110. Rather than re-routing the subset of I/Os used to communicate with the host 110, the hybrid memory module 120 may take advantage of other I/Os of the memories of the volatile memory 122 by setting a mode of operation for the memories of the volatile memory 122 to communicate with the control circuit 124 via the control circuit bus 130 using some or all of the other I/Os. For example, rather than including switching circuitry to switch the I/Os 0-k of the memories of the volatile memory 122 from the host bus to the control circuit bus 130, the memories of the volatile memory 122 may be reconfigured (e.g., programmed for a different mode of operation) to use different I/Os, which may improve operating speed, increase available real estate space, and reduce cost.

Figure 2:
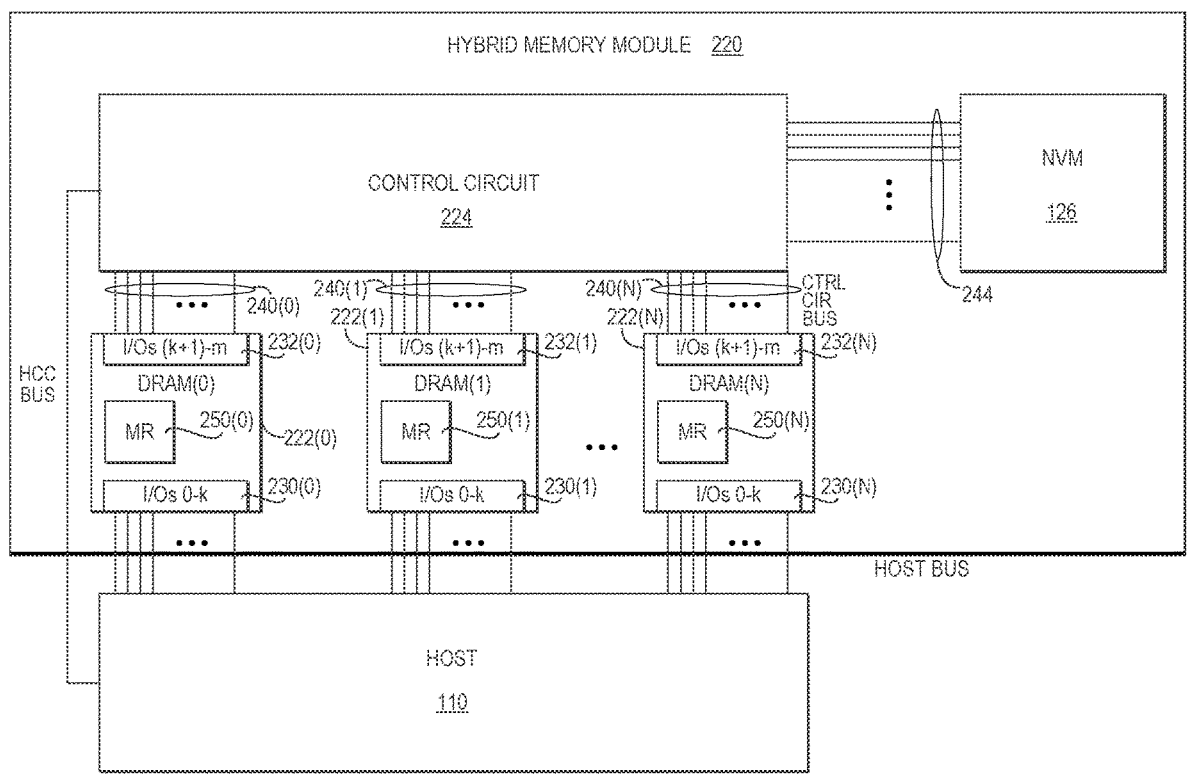
FIG. 2 is a block diagram of a particular illustrative embodiment of an apparatus including a hybrid memory module according to an embodiment of the disclosure.

Referring to FIG. 2, a particular illustrative embodiment of an apparatus including a hybrid memory module 220 according to an embodiment of the invention is disclosed and generally designated 200. The hybrid memory module may include memories 222(0-N). The memories 222(0-N) are configured to store information and may be accessed to read and write information. The memories 222(0-N) may be accessed by providing commands and addresses for memory access operations. Some or all of the memories 222(0-N) may have respective I/Os 0-m (0-N), that may be used for communication. The hybrid memory module 220 may further include a control circuit 224 that may communicate with the memories 222(0-N) over a control circuit bus. The control circuit bus includes control circuit busses 240(0-N), each of which is coupled to a respective one of the memories 222(0-N). The control circuit 224 may be coupled to a NVM 126 via an NVM bus 244. The control circuit 224 may also be coupled to the host 110 via a host-control circuit (HCC) bus. The memories 222(0-N) may be configured to communicate with a host 110 over a host bus using respective I/Os 0-k (0-N) 230(0-N) and/or may selectively communicate with the control circuit 224 over the respective control circuit bus 240(0-N) using I/Os (k+1)-m (0-N) 232(0-N). The hybrid memory module 220 may be included in the hybrid memory module 120 of FIG. 1. The apparatus 200 includes elements that have been previously described with respect to the apparatus 100 of FIG. 1. Those elements have been shown in FIG. 2 using the same reference numbers used in FIG. 1, and operation of the common elements is as previously described. Consequently, a detailed description of the operation of these elements will not be repeated in the interest of brevity.

The memories 222(0-N) may be in some embodiments volatile memories, and may represent a volatile memory space of the hybrid memory module 220. The memories may include any type of memory architecture, including any double data rate (DDR) synchronous DRAM (SDRAM) architecture (e.g., DDR SDRAM, DDR2 SDRAM, DDR3 SDRAM, DDR4 SDRAM, etc.). Each of the memories 222(0-N) may be configured according to a ×4, ×8, ×16, or greater architecture (e.g., includes 4, 8, 16, or greater I/Os, respectively). Each of the memories 222(0-N) may include a respective mode register 250(0-N) that is configured to store operating parameters for the memories 222(0-N). In some embodiments the mode registers may be programmed with information for modes of operation that designate subsets of I/Os 0-m (0-N) for communication. For example, the mode register may be programmed with information for a first mode of operation that designates respective I/Os 0-k (0-N) 230(0-N) for communication (e.g., communication over a host bus) and may be programmed with information for a second mode of operation that designates respective I/Os (k+1)-m (0-N) 232(0-N) for communication (e.g., communication over a control circuit bus 240).

The control circuit 224 may transfer information between the memories 222(0-N) and the NVM 126. The control circuit 224 may include an application-specific integrated circuit (ASIC), a field-programmable gate array (FPGA), or other circuitry. The control circuit 224 may perform error checking functions during the transfer of information between the memories 222(0-N) and the NVM 126.

In operation, the memories 222(0-N) may selectively communicate with the host 110 and/or the control circuit 224 via the respective subset of I/Os 0-k (0-N) 230(0-N) and I/Os (k+1)-m 232(0-N) based on a mode of operation. The host 110 may set the memories 222(0-N) to a first mode of operation by sending mode register commands to the memories 222(0-N) to program information for the first mode of operation. In some embodiments, communication between the memories 222(0-N) and the control circuit 224 may be disabled when in a first mode of operation. The host 110 may initiate transition to a second mode of operation by sending a command to the control circuit 224 via the HCC bus to transition to the second mode. In the second mode, the host 110 relinquishes control of the memories 222(0-N) to the control circuit 224. The control circuit 224 may set the memories 222(0-N) of the hybrid memory module 220 to a second mode of operation by sending mode register commands to the memories 222(0-N) to program information for the second mode of operation. While in the second mode of operation, the memories 222(0-N) may communicate with the control circuit 224 via the control circuit bus 244. In the second mode of operation, information stored by the memories 222(0-N) and information stored by the NVM 126 may be transferred between the two, with the control circuit 224 managing the transfer of information between the memories 222(0-N) and the NVM 126.

While in the second mode of operation, communication between the memories 222(0-N) and the control circuit 224 may use a different subset of I/Os than the subset of I/Os used by the memories 222(0-N) for communication with the host 110 via the host bus. For example, in the first mode of operation, the memories 222(0-N) may be configured to communicate with the host 110 via the host bus using the respective I/Os 0-k 230(0-N) (e.g., the first subset of I/Os). In a second mode of operation, the memories 222(0-N) may be configured to communicate with the control circuit 224 via the control circuit bus using the respective I/Os (k+1)-m 232(0-N) (e.g., the second subset of I/Os).

As previously described, the memories 222(0-N) may receive mode register commands to program information in the mode registers from the host 110 or the control circuit 224. The memories 222(0-N) may use different subsets of I/Os 0-m for communication based on the information programmed in the mode registers. For example, the mode registers 250(0-N) may be programmed with information for the first mode of operation, and each of the memories 222(0-N) may enable communication over the respective I/Os 0-k 230(0-N). The memory access operations while in the first mode of operation may include the host 110 retrieving data from and providing data to the memories 222(0-N). The mode registers 250(0-N) may be programmed with information for the second mode of operation, and each of the DRAMs 222(0-N) may enable communication over the respective I/Os (k+1)-m 232(0-N). In the second mode of operation, the memory access operations may include the control circuit 224 retrieving data from and providing data to the memories 222(0-N). For example, in the second mode of operation, the control circuit 224 may transfer data from the memories 222(0-N) to the NVM 126.

The first and second modes of operation for the memories of the volatile memory 122 and the memories 222(0-N) may be separately enabled and disabled. In some embodiments, the first and second modes of operation may be mutually exclusive modes of operation, that is, either the first or second mode of operation may be set thereby the memories of the volatile memory 122 may communicate using either the first subset of I/Os (e.g., I/Os 0-k) or the second subset of I/Os (e.g., I/Os (k+1)-m). In some embodiments, the first and second modes of operation may be set concurrently for the memories of the volatile memory 122 to communicate over one or more subsets of I/Os. The memories of the volatile memory 122 and the memories 222(0-N) may be in different modes of operation. For example, some of the memories may be in a first mode of operation, while others may be in a second mode of operation. As a result, some of the memories may communicate through different subsets of I/Os. Although previously described having two modes of operation and two subsets of I/Os, embodiments of the invention are not limited as such. Memories may be configured to have greater than two modes of operation for communicating through more than two subsets of I/Os. In some embodiments, some of the memories of a hybrid memory module may have I/Os that are multiplexed through a multiplexer circuit for communication. That is, the I/Os 0-m of one or more of the memories may have some or all of the I/Os coupled to different busses and be enabled through modes of operation, and other I/Os may be coupled through a multiplexer circuit to different busses.

Figure 3:
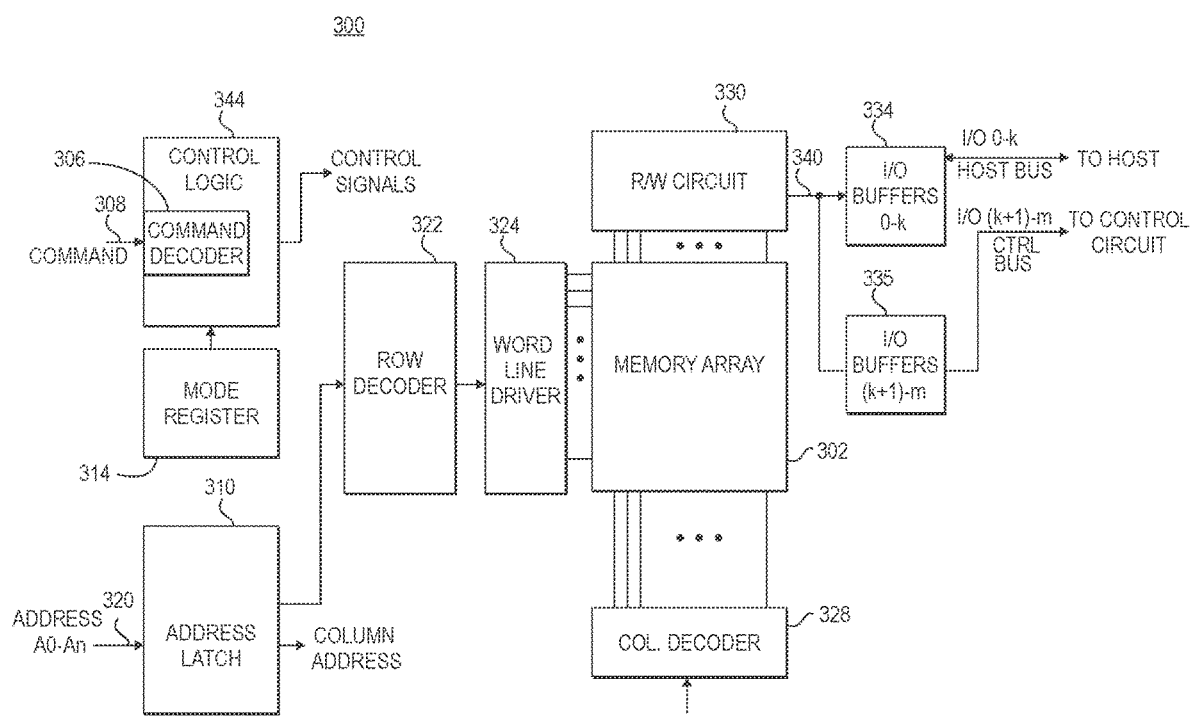
FIG. 3 is a block diagram of a memory according to an embodiment of the disclosure.

FIG. 3 illustrates a portion of a memory 300 according to an embodiment of the present disclosure. The memory 300 includes a memory array 302 of memory cells, which may be, for example, volatile memory cells (e.g., DRAM memory cells, SRAM memory cells), non-volatile memory cells (e.g., flash memory cells, phase change memory cells), or some other types of memory cells. The memory 300 includes control logic 344 that receives memory commands through a command bus 308 and generates corresponding control signals within the memory 300 to carry out various memory operations. The control logic 344 may include a command decoder 306 that decodes the received commands, and the control logic 344 uses the decoded commands to generate internal control signals. For example, the control logic 344 is used to generate internal control signals to read data from and write data to the memory array 302, or to set a mode of operation for the memory 300.

The control logic 344 may be coupled to a mode register 314. The mode register 314 may be programmed with information used by the control logic 344 to configure operation of the memory 300. In some embodiments, the mode register 314 may be programmed with information that indicates a mode of operation. Example modes of operation include configuring the I/O buffers 334 and 335 that the memory 300 uses to communicate with external circuitry based on the information programmed in the mode register 314. For example, the mode register 314 may be programmed with information for a first mode of operation that enables the I/O buffers 0-k 334 to be used for communication. Further, the mode register 314 may be programmed with information for a second mode of operation that enables the I/O buffers (k+1)-m 335 to be used for communication. The mode register 314 may also be programmed with information that indicates to the control logic 344 to disable I/O buffers 0-k 334 and/or I/O buffers (k+1)-m 335. The memory 300 may be included in one of the memories of the volatile memory 122 of FIG. 1 and/or one of the memories 222(0-N) of FIG. 2.

Row and column address signals are applied to the memory 300 through an address bus 320 and provided to an address latch 310. The address latch then outputs a separate column address and a separate row address. The row and column addresses are provided by the address latch 310 to a row decoder 322 and a column address decoder 328, respectively. The column address decoder 328 selects bit lines extending through the memory array 302 corresponding to respective column addresses. The row decoder 322 is connected to wordline driver 324 that activates respective rows of memory cells in the memory array 302 corresponding to received row addresses. The selected digit line (e.g., a bit line or bit lines) corresponding to a received column address are coupled to a read/write circuit 330 to provide read data to I/O buffers 0-k 334 and/or I/O buffers (k+1)-m 335 via an input-output data bus 340.

As previously described, the control logic 344 may receive mode register commands for programming information into the mode register 314, and the information in the mode register 314 may control mode of operation of the memory 300. The control logic 344 determines a mode of operation based on the information programmed in the mode register 314. While in a first mode of operation, the control logic 344 may enable the I/O buffers 0-k 334 to provide read data and receive write data. While in a second mode of operation, the control logic 344 may enable the I/O buffers (k+1)-m 335 to provide read data and receive write data.

Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as previously described.

What is claimed is:

1. A method, comprising:
   receiving, at a memory module from a host, a command to perform a save operation, wherein the save operation includes saving data of a volatile memory of the memory module to a non-volatile memory (NVM) of the memory module;
   in response to the command, programming, by the memory module, a mode register of the volatile memory with information that configures the volatile memory to enable transfer of the data from the volatile memory to the NVM.

2. The method of claim 1, further comprising transferring the data from the volatile memory to the NVM via a control circuit of the memory module in response to the command.

3. The method of claim 1, wherein the command is associated with a power failure event.

4. The method of claim 1, further comprising receiving, from a host, a second command to perform a restore operation, including transferring data of the NVM to the volatile memory.

5. The method of claim 4, wherein the second command is associated with initial application of power to the memory module.

6. The method of claim 4, further comprising resuming communication with the host in response to completion of the restore operation.

7. The method of claim 6, further comprising programming the mode register to indicate a normal mode of operation to resume communication with the host.

8. The method of claim 1, further comprising avoiding command signaling from the host while performing the save operation.

9. The method of claim 1, further comprising causing the volatile memory to communicate with a control circuit of the memory module to perform the save operation.

10. The method of claim 1, wherein the volatile memory is dynamic, random-access memory.

11. An apparatus, comprising:
a volatile memory;
a non-volatile memory (NVM);
a control circuit coupled between the NVM and the volatile memory and configured to facilitate a save operation to cause transfer of data from the volatile memory to the NVM in response to a command to perform the save operation; and
a mode register coupled with the volatile memory and programmable, by the control circuit, with information that configures the volatile memory to enable transfer of the data to the NVM.

12. The apparatus of claim 11, wherein the command is received from a host.

13. The apparatus of claim 12, wherein the volatile memory is configured to avoid communication with the host during the save operation.

14. The apparatus of claim 13, wherein the memory module is configured to avoid communication with the host via a host bus.

15. The apparatus of claim 11, wherein the control circuit is configured to cause the volatile memory to transfer data to the NVM in response to the command.

16. The apparatus of claim 11, wherein the command is associated with a power failure event.

17. The apparatus of claim 11, wherein the control circuit is further configured to receive a second command to perform a restore operation, including transferring data of the NVM to the volatile memory.

18. The apparatus of claim 17, wherein the second command is associated with initial application of power to the memory module.

19. The apparatus of claim 17, wherein the volatile memory is further configured to resume communication with a host in response to completion of the restore operation.

20. The apparatus of claim 19, wherein the memory module is configured to program the mode register to indicate a normal mode of operation to resume communication with the host.

* * * * *